(12) United States Patent
Oh et al.

(10) Patent No.: US 9,837,419 B2
(45) Date of Patent: Dec. 5, 2017

(54) 3D SEMICONDUCTOR DEVICE WITH REDUCED CHIP SIZE

(71) Applicant: SK hynix Inc., Gyeonggi-do (KR)

(72) Inventors: Sung Lae Oh, Chungcheongbuk-do (KR); Dae Sung Eom, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 63 days.

(21) Appl. No.: 14/789,505

(22) Filed: Jul. 1, 2015

(65) Prior Publication Data
US 2016/0276261 A1 Sep. 22, 2016

(30) Foreign Application Priority Data
Mar. 20, 2015 (KR) .................. 10-2015-0039064

(51) Int. Cl.
*H01L 27/08* (2006.01)
*H01L 29/76* (2006.01)
*H01L 21/70* (2006.01)
*H01L 27/105* (2006.01)
*H01L 27/11519* (2017.01)
*H01L 27/11529* (2017.01)
*H01L 27/11556* (2017.01)
*H01L 27/11565* (2017.01)
*H01L 27/11573* (2017.01)
*H01L 27/11582* (2017.01)

(52) U.S. Cl.
CPC .... *H01L 27/1052* (2013.01); *H01L 27/11519* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/06; H01L 29/78; H01L 27/11; H01L 27/09; H01L 29/79; H01L 21/02; H01L 21/28; H01L 21/82; H01L 27/10; H01L 27/08
USPC .......... 257/369, 314, 324, 401, E27.06, 382, 257/774, E21.401, 113, 116
See application file for complete search history.

(56) References Cited

U.S. PATENT DOCUMENTS

| | | | | |
|---|---|---|---|---|
| 2004/0151041 A1* | 8/2004 | Lee | .......................... | G11C 7/02 365/200 |
| 2005/0253287 A1* | 11/2005 | Liaw | ....................... | G11C 8/16 365/230.05 |
| 2007/0252201 A1* | 11/2007 | Kito | .................... | H01L 21/8221 257/331 |
| 2008/0031029 A1* | 2/2008 | Liaw | ....................... | G11C 7/18 365/63 |

(Continued)

FOREIGN PATENT DOCUMENTS

| | | |
|---|---|---|
| KR | 1020120062506 | 6/2012 |
| KR | 1020120101911 | 9/2012 |
| KR | 1020140029703 | 3/2014 |

*Primary Examiner* — Sheikh Maruf
(74) *Attorney, Agent, or Firm* — IP & T Group LLP (57) ABSTRACT

A semiconductor device includes a first memory block and a second memory block in a cell region and a first transistor and a second transistor, respectively corresponding to the first and second memory blocks, in a pass transistor region located below the cell region, wherein each of the first and second transistors includes: a first gate electrode coupled to the first memory block and a second gate electrode coupled to the second memory block.

19 Claims, 9 Drawing Sheets

(56) References Cited

U.S. PATENT DOCUMENTS

| | | | | |
|---|---|---|---|---|
| 2008/0273382 A1* | 11/2008 | Wang | G11C 11/412 | 365/181 |
| 2009/0268499 A1* | 10/2009 | Kouchi | G11C 11/412 | 365/51 |
| 2009/0268522 A1* | 10/2009 | Maejima | G11C 5/02 | 365/185.11 |
| 2010/0133599 A1* | 6/2010 | Chae | H01L 27/11578 | 257/315 |
| 2010/0259961 A1* | 10/2010 | Fasoli | B82Y 10/00 | 365/51 |
| 2010/0309729 A1* | 12/2010 | Chang | H01L 21/28282 | 365/185.28 |
| 2011/0211384 A1* | 9/2011 | Perisetty | G11C 8/16 | 365/154 |
| 2011/0309322 A1* | 12/2011 | Hwang | G11C 13/0007 | 257/5 |
| 2011/0316072 A1* | 12/2011 | Lee | H01L 27/11551 | 257/329 |
| 2012/0140586 A1* | 6/2012 | Kim | G11C 5/02 | 365/230.03 |
| 2012/0147649 A1* | 6/2012 | Samachisa | G11C 13/0002 | 365/51 |
| 2012/0195151 A1* | 8/2012 | Ostermayr | G11C 11/412 | 365/230.05 |
| 2012/0228714 A1* | 9/2012 | Lim | H01L 27/1104 | 257/369 |
| 2012/0257452 A1* | 10/2012 | Kim | G11C 16/0483 | 365/185.11 |
| 2013/0009230 A1* | 1/2013 | Cleeves | H01L 23/528 | 257/314 |
| 2013/0229846 A1* | 9/2013 | Chien | H01L 27/2454 | 365/51 |
| 2013/0341797 A1* | 12/2013 | Lim | H01L 23/50 | 257/773 |
| 2014/0014889 A1* | 1/2014 | Shim | H01L 29/7827 | 257/1 |
| 2014/0061748 A1* | 3/2014 | Lee | H01L 29/78 | 257/314 |
| 2014/0225183 A1* | 8/2014 | Park | H01L 27/0207 | 257/324 |
| 2015/0001613 A1* | 1/2015 | Yip | H01L 27/115 | 257/329 |
| 2015/0357342 A1* | 12/2015 | Lee | H01L 21/28282 | 257/324 |
| 2016/0049201 A1* | 2/2016 | Lue | G11C 16/0483 | 365/185.11 |

* cited by examiner

FIG. 1A

| A Block | B Block | C Block | D Block |
|---------|---------|---------|---------|
| A_1 TR  | B_1 TR  | C_1 TR  | D_1 TR  |
| A_2 TR  | B_2 TR  | C_2 TR  | D_2 TR  |
| A_3 TR  | B_3 TR  | C_3 TR  | D_3 TR  |
| A_4 TR  | B_4 TR  | C_4 TR  | D_4 TR  |

3D SEMICONDUCTOR DEVICE WITH REDUCED CHIP SIZE

CROSS-REFERENCE TO RELATED APPLICATION

The present application claims priority under 35 U.S.C. §119 to Korean patent application No. 10-2015-0039064 filed on Mar. 20, 2015 in the Korean Intellectual Property Office, the disclosure of which is incorporated in its entirety by reference.

TECHNICAL FIELD

Embodiments of the present disclosure relate to a semiconductor device and, more particularly, to a layout of a three-dimensional (3D) non-volatile memory device.

RELATED ART

In order to increase the degree of integration of semiconductor devices, memory cells are three-dimensionally (3D) arranged over a semiconductor substrate. The memory cells of a 3D semiconductor device are stacked over a semiconductor substrate, resulting in the formation of memory strings.

Memory cells contained in the memory strings of 3D semiconductor devices are coupled to word lines stacked on the semiconductor substrate. The word lines formed in a memory array region are coupled to global lines through transistors formed in a peripheral region. The global lines are formed in the peripheral region so that the operation voltages are transmitted through the global lines.

If the number of stacked memory cells in a 3D semiconductor device increases, the number of stacked word lines also increases. If the number of stacked word lines increases, the layout of patterns for coupling the word lines, global lines, and transistors becomes complicated, consuming an excessive amount of chip space area.

BRIEF SUMMARY OF THE INVENTION

An embodiment relates to a semiconductor device in which two transistors are arranged to share one global word line, so that the consumed semiconductor device chip area is reduced. Additionally, an efficient metal line structure is proposed. In accordance with an aspect of the present disclosure, a semiconductor device includes a first memory block and a second memory block in a cell region; and a first transistor and a second transistor, respectively corresponding to the first and second memory blocks, in a pass transistor region located below the cell region, wherein each of the first and second transistors includes: a first gate electrode coupled to the first memory block; and a second gate electrode coupled to the second memory block. Each of the first and second transistors further includes: an active region, wherein the first gate electrode and the second gate electrode are arranged over and cross the active region.

Each of the first memory block and the second memory block includes: a word line multilayered structure that extends in parallel to a long axis of the active region. A plurality of transistors, as the first or second transistor, arranged along the long axis of the active region direction the first memory block and the second memory block.

The first memory block and the second memory block are separated from each other by a slit.

Each of the first memory block and the second memory block includes: a pad structure having a step-shaped word line multilayered structure.

The first gate electrode and the second gate electrode are coupled to respective pad structures contained in the first memory block and the second memory block.

The first gate electrode is coupled to the first memory block through a first local line contact plug.

The first local line contact plug is formed over the active region at one side of the first gate electrode.

The second gate electrode is coupled to the second memory block through a second local line contact plug.

The second local line contact plug is formed over the active region at one side of the second gate electrode.

A global line contact plug coupled to the active region between the first gate electrode and the second gate electrode; and a global word line coupled to the global contact plug.

In accordance with another aspect of the present disclosure, a semiconductor device comprising: a cell region configured to include a first memory block and a second memory block; and a pass transistor region located below the cell region, wherein the pass transistor region includes: a first transistor located below the first memory block, and includes a first gate electrode coupled to the first memory block and a second gate electrode coupled to the second memory block; and a second transistor located below the second memory block, and includes a third gate electrode coupled to the first memory block and a fourth gate electrode coupled to the second memory block.

The pass transistor region includes a first active region and a second active region, the first gate electrode and the second gate electrode are formed over a first active region, and the third gate electrode and the fourth gate electrode are formed over a second active region.

Each of the first memory block and the second memory block includes a word line multilayered structure extended along a direction parallel to long axes of the first active region and the second active region.

The first memory block and the second memory block are separated from each other by a slit, and each of the first memory block and the second memory block further includes a pad structure having a step-shaped word line multilayered structure.

The first gate electrode and the third gate electrode are coupled to a pad structure contained in the first memory block through a first local contact plug.

The first local contact plug is located not only over the first active region arranged at one side of the first gate electrode, but also over the second active region arranged at one side of the third gate electrode.

The second gate electrode and the fourth gate electrode are coupled to a pad structure contained in the second memory block through a second local contact plug.

The second local contact plug is located not only over the first active region arranged at one side of the second gate electrode, but also over the second active region arranged at one side of the fourth gate electrode.

A global contact plug coupled not only to the first active region disposed between the first gate electrode and the second gate electrode, but also to the second active region disposed between the third gate electrode and the fourth gate electrode; and a global word line coupled to the global contact plug. It is to be understood that both the foregoing general description and the following detailed description are exemplary and explanatory and are intended to explain the claims.

DESCRIPTION OF EMBODIMENTS

Exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Wherever possible, the same reference numbers will be used throughout the drawings to refer to the same or like parts. A detailed description of well known configurations or functions will be omitted when it may make the subject matter less clear.

Figure 1A:
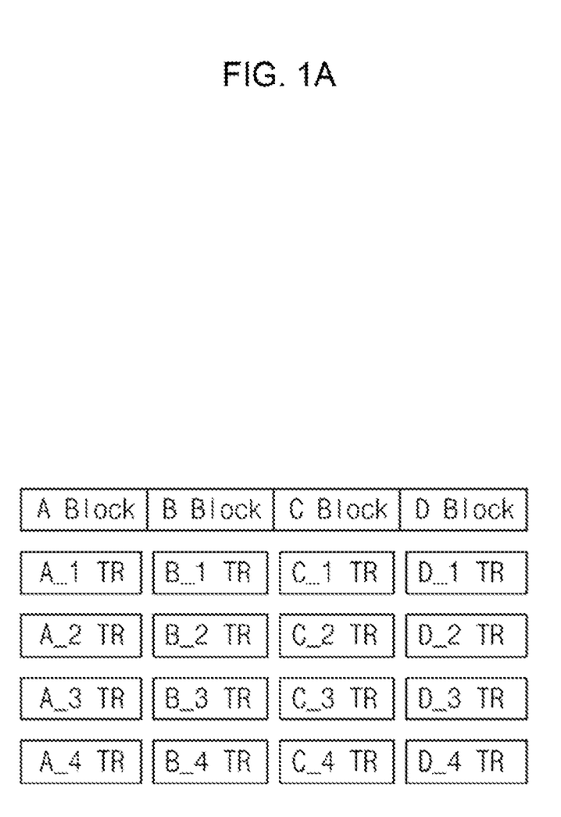
FIGS. 1A and 1B are schematic diagrams illustrating a pass transistor region of a conventional semiconductor device.
Figure 1B:
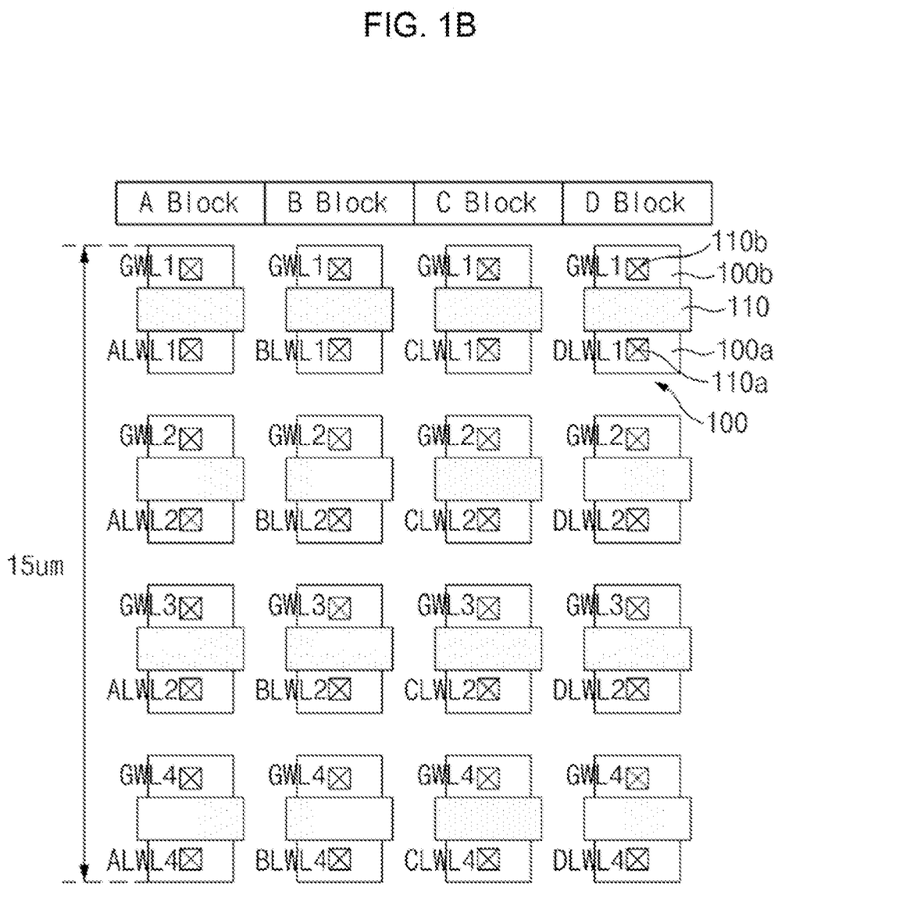

FIGS. 1A and 1B are schematic diagrams illustrating a pass transistor region of a conventional semiconductor device.

Referring to FIGS. 1A and 1B, a plurality of transistors, isolated from each other, may be arranged in one memory block, and each isolated transistor may be composed of one gate electrode. The individual isolated transistors are to be spaced apart from each other by a predetermined distance.

In more detail, a plurality of active regions 100 may be isolated from each other. In each active region 100, one gate electrode 110 may be arranged to cross the active region 100, and junction regions (100a, 100b) may be formed in the active region 100 at both sides of the gate electrode 110. A local word-line contact 110a is coupled to one junction region 100a, and a global word-line contact 110b is coupled to the other junction region 100b.

In the above-mentioned structure, as many transistors as word lines stacked along an extension direction of the word line multilayered structure are to be arranged, and individual transistors are spaced apart from each other by a predetermined distance, so that the chip size of a semiconductor device may unavoidably increase. In addition, a separate local word line and a separate global word line are to be arranged in each isolated transistor, occupying a greater amount of space.

Figure 2A:
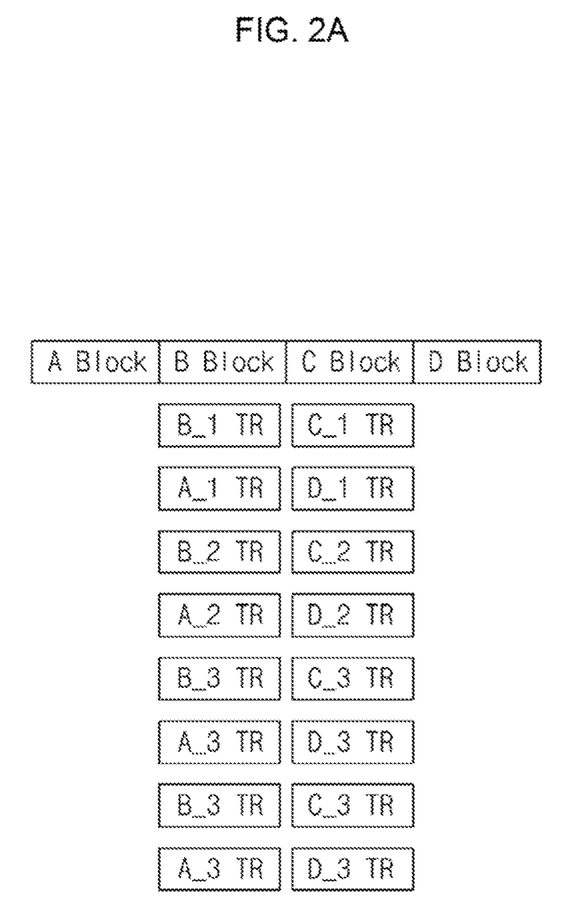
FIGS. 2A and 2B are schematic diagrams illustrating a pass transistor region of another conventional semiconductor device.
Figure 2B:
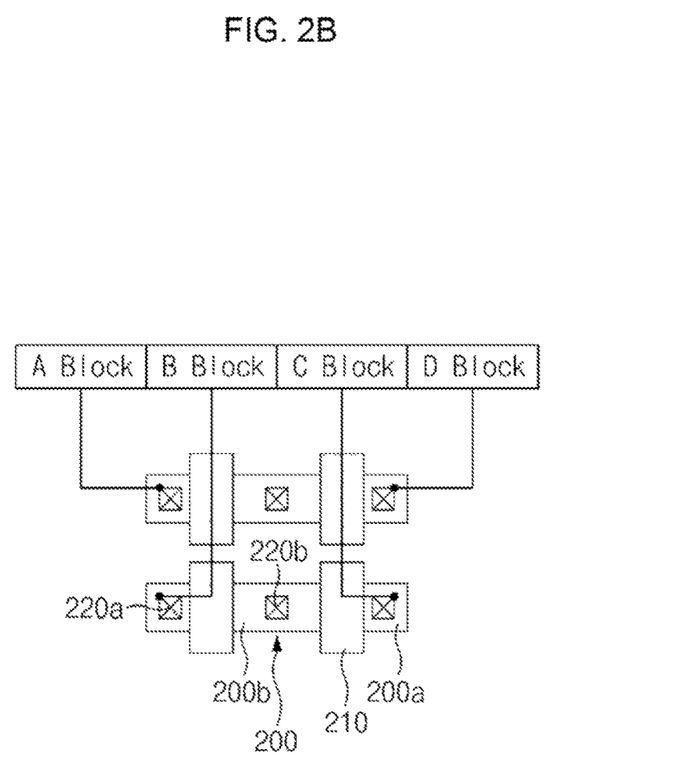

FIGS. 2A and 2B are schematic diagrams illustrating a pass transistor region of another conventional semiconductor device.

Referring to FIGS. 2A and 2B, two transistors are contained in four memory blocks.

Two gate electrodes 210 are arranged in one active region 200, and junction regions (200a, 200b) are formed in the active region 200 located at both sides of the gate electrode 210. A local word-line contact 220a is coupled to one junction region 200a, and a global word-line contact 220b is coupled to the other junction region 200b.

A maximum of two gate electrodes 210 may be formed in one active region 200. Therefore, two transistors each having two gate electrodes 210 arranged in one active region 200 are to be stacked and coupled to 4 word line multilayered structures.

That is, although two transistors are arranged in 4 memory block pitches, transistors are stacked in two rows. As described above, when the word line multilayered structures are continuously stacked to increase the integration of a semiconductor device without increasing the pitch of a memory block, transistors are repeatedly arranged along the extension direction of word lines, resulting in an increased chip size.

Figure 3A:
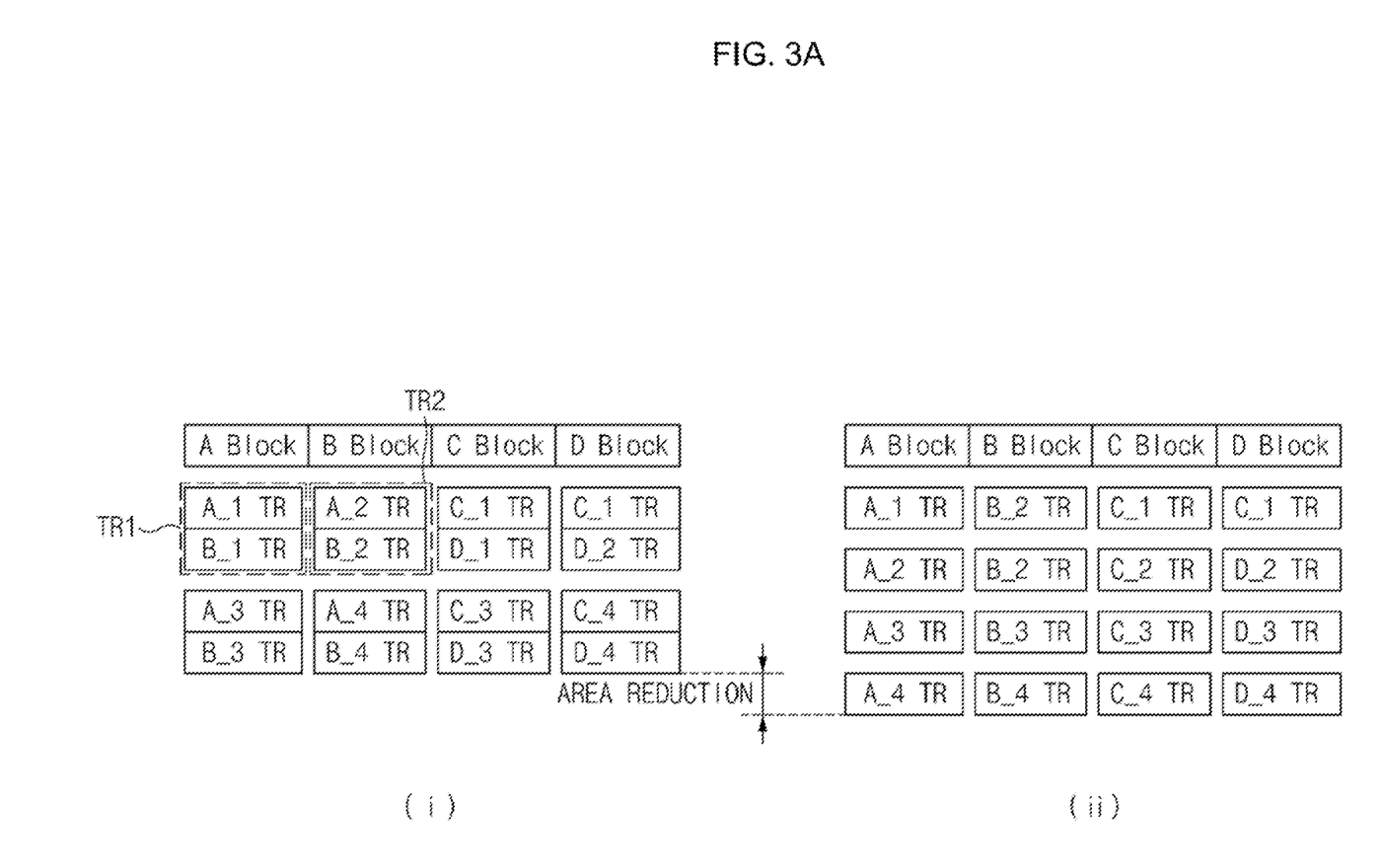
FIGS. 3A to 3C are schematic diagrams illustrating arrangements in a pass transistor region of a semiconductor device according to an embodiment of the present disclosure.
Figure 3B:
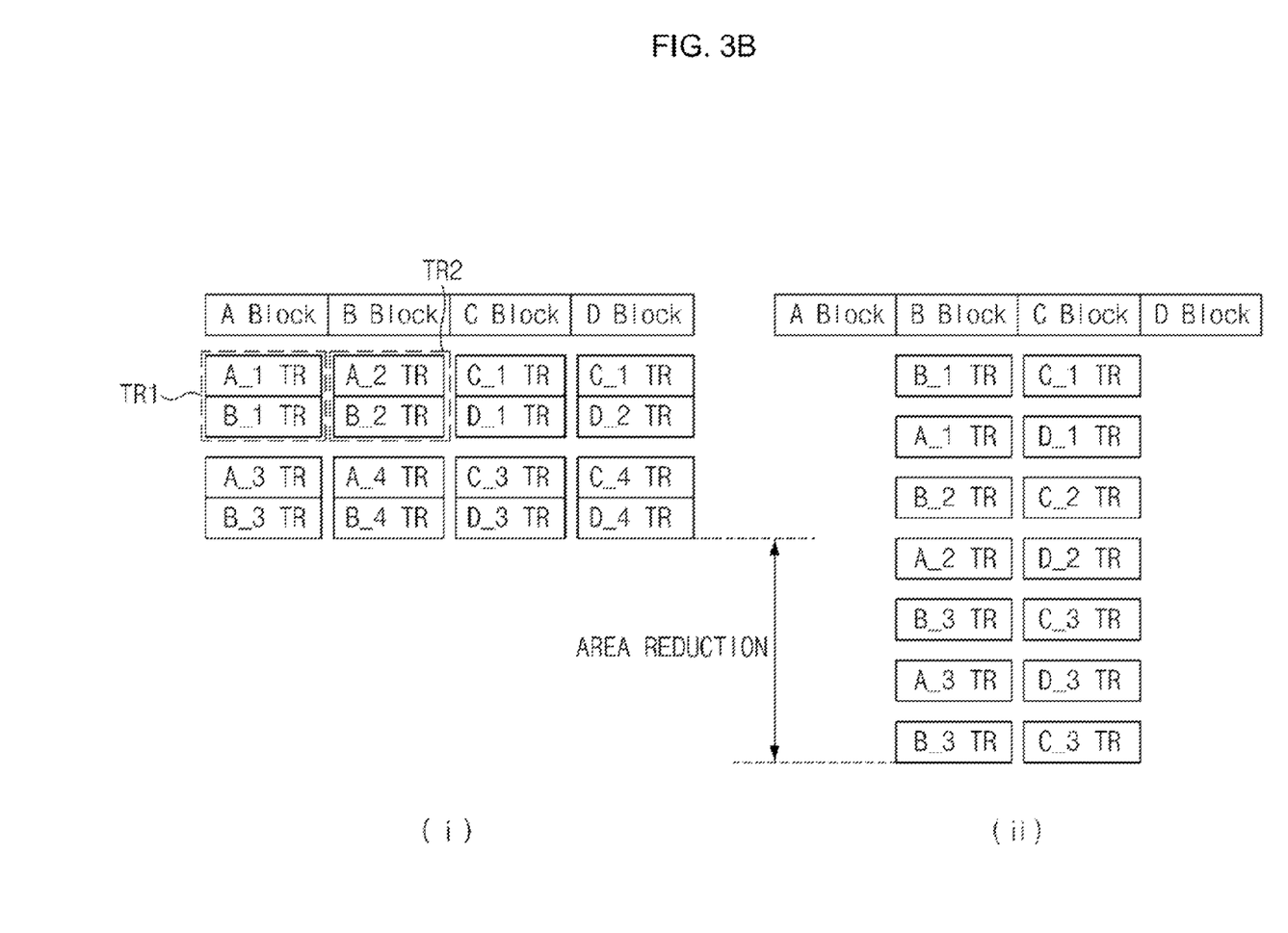
Figure 3C:
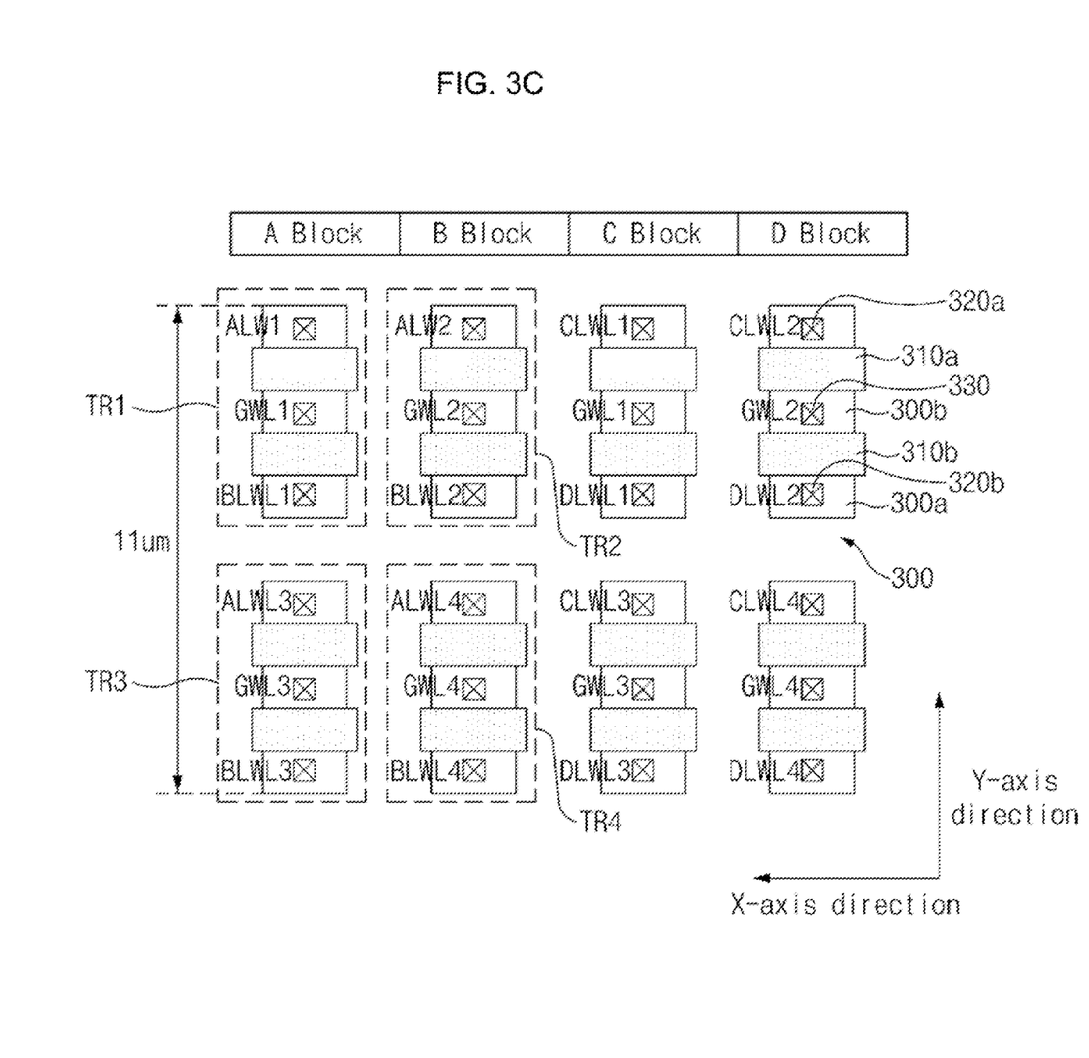

FIGS. 3A to 3C are schematic diagrams illustrating arrangements in a pass transistor region of a semiconductor device according to an embodiment of the present disclosure. FIG. 3A illustrates the comparison result with the arrangement structure and the area availability of the pass transistor region shown in FIG. 1A (FIG. 3A(ii)). FIG. 3B illustrates the comparison result with the arrangement structure and the area availability of the pass transistor region shown in FIG. 2A (FIG. 3B(ii)).

Referring to FIG. 3A(i) and FIG. 3B(i), a plurality of memory blocks (A Block, B Block, C Block, D Block) may be arranged in a cell region. Transistors configured to transmit operation voltages to the memory blocks in response to a block selection signal may be arranged in the pass transistor region located below the cell region.

Two contiguous memory blocks may be arranged to share two transistors.

In more detail, a first transistor group TR1 may include a first pass transistor (A_1 TR) coupled to a first memory block (A Block), and a second pass transistor (B_1 TR) coupled to a second memory block (B Block). A second transistor group TR2 may include a third pass transistor (A_2 TR) coupled to the first memory block A, and a fourth pass transistor (B_2 TR) coupled to the second memory block (B Block).

Conventionally, individual transistors are to be spaced apart from each other by a predetermined distance as shown in FIG. 3A(ii) and 3B(ii), resulting in an increased chip size.

In accordance with the present disclosure, one transistor group includes two pass transistors as shown in FIGS. 3A(i) and 3B(i), so that two pass transistors may use a global word line in common.

That is, two transistor groups are arranged in two memory block pitches, thereby greatly reducing the area of an arrangement structure as compared to the conventional arrangement structure.

Transistors formed in the pass transistor region will hereinafter be described with reference to FIG. 3C.

A plurality of active regions 300 may be arranged. Each active region 300 may be formed in a bar shape including a short-axis (X-axis direction) and a long-axis (Y-axis direction). In this case, the long-axis of the active region 300 is in a first direction indicating an extension direction of the word line multilayered structure of a memory block, and the short-axis of the active region 300 is in a second direction, perpendicular to the word line multilayered structure of the memory block.

Two gate electrodes may be arranged to cross one active region 300. That is, a first gate electrode 310a and a second gate electrode 310b may be arranged to cross the active region 300.

A first junction region 300a is formed in the edge part of the active region 300 located at one side of each of the first gate electrode 310a and the second gate electrode 310b, and a second junction region 300b may be formed in the center part of the active region 300, disposed between the first gate electrode 310a and the second gate electrode 310b. In this case, the first junction region 300a is a source junction region, and the second junction region 300b is a drain junction region.

A first local line contact 320a is arranged in the first junction region 300a located at one side of the first gate electrode 310a, and a second local line contact 320b is arranged in the first junction region 300a located at one side of the second gate electrode 310b. In addition, a global line contact 330 is arranged in the second junction region 300b.

Conventionally, a local word line and a global word line are arranged such that individual transistors are spaced apart from each other by a predetermined distance, and the local word line and the global word line are in each memory block. That is, as the global word line is in each memory block, the occupied space increases. On the other hand, according to the embodiment of the present disclosure, transistors are arranged such that two memory blocks may use the global word line in common, and the space available increases, resulting in reduced chip size.

Figure 4:
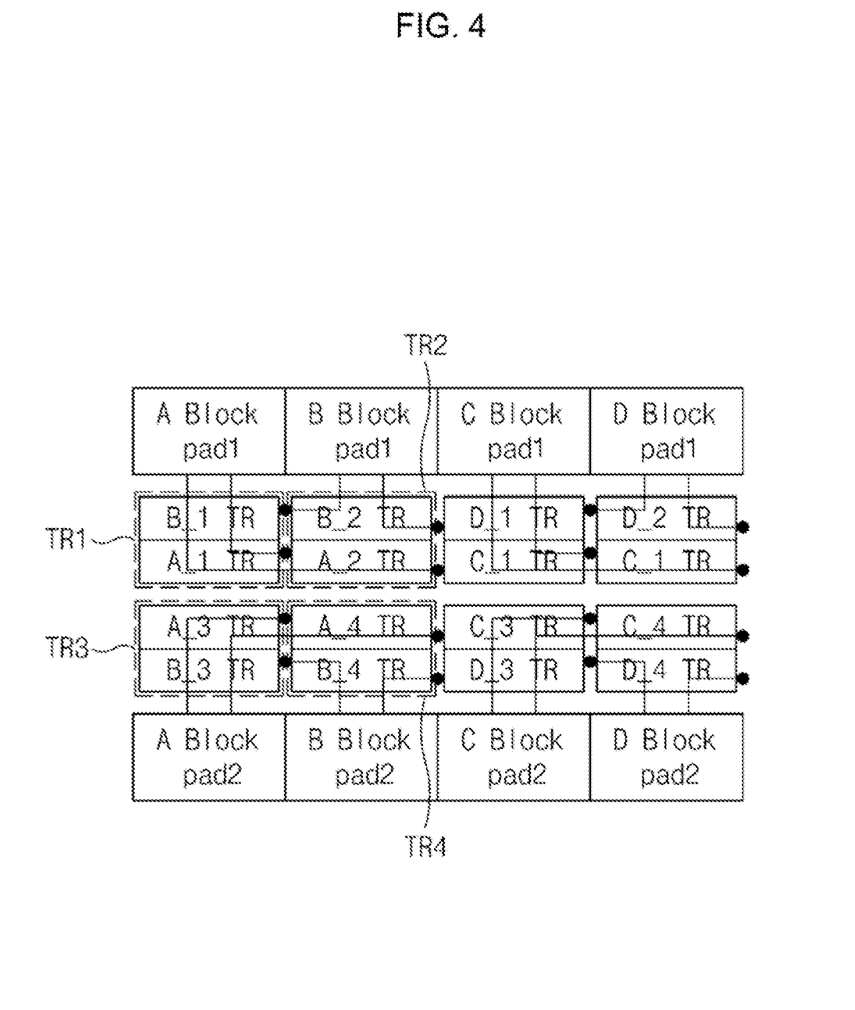
FIGS. 4 and 5 are a schematic diagram and a stereoscopic view illustrating the connection relationship between a pass transistor region and a pad structure of a memory block of a semiconductor device according to an embodiment of the present disclosure.

FIG. 4 illustrates the arrangement structure of a pass transistor region of a semiconductor device and the connection relationship between memory blocks and pass transistors.

A plurality of memory blocks (A Block, B Block, C Block, D Block) may be arranged in the cell region. Transistors configured to transmit the operation voltages to the memory blocks in response to a block selection signal may be arranged in the pass transistor region, located below the cell region.

The connection relationship between memory blocks and pass transistors according to an embodiment of the present disclosure will hereinafter be described with reference to FIG. 4.

The cell region includes a first memory block (A Block) and a second memory block (B Block). Although a plurality of memory blocks may be isolated from each other and arranged in the cell region as shown in FIG. 4, the embodiment will hereinafter be described on the basis of two memory blocks for better understanding of the present disclosure.

The pass transistor region may include a first transistor group TR1 that is composed of a first pass transistor (A_1 TR) coupled to the first memory block (A Block) and a second pass transistor (B_1 TR) coupled to the second memory block (B Block). In this case, the first pass transistor (A_1 TR) is coupled to a first pad structure (A Block pad1) of the first memory block (A Block) through a first local line contact plug, and the second pass transistor (B_1 TR) is coupled to a first pad structure (B Block pad1) of the second memory block (B Block) through a second local line contact plug.

Transistors having the same arrangement structure as the first transistor group TR1 may be repeatedly arranged along the extension direction of the first memory block (A Block).

For example, a third transistor group TR3 may include a first pass transistor (A_3 TR) coupled to the first memory block (A block) and a second pass transistor (B_3 TR) coupled to the second memory block (B Block). In this case, the first pass transistor (A_3 TR) is coupled to a second pad structure (A Block pad2) of the first memory block (A Block) through a first local line contact plug, and the second pass transistor (B_3 TR) is coupled to a second pad structure (B Block pad2) of the second memory block (B Block) through a second local line contact plug.

As described above, one memory block may include a plurality of pad structures, and a plurality of transistors corresponding to one memory block may be coupled to the memory block through different pad structures.

In addition, a second transistor group TR2 is located below the second memory block (B Block), and includes a first pass transistor (A_2 TR) coupled to the first memory block (A Block) and a second pass transistor (B_2 TR) coupled to the second memory block (B Block). In this case, the first pass transistor (A_2 TR) is coupled to the first pad structure (A Block pad1) of the first memory block (A Block) through a first local line contact plug, and the second pass transistor (B_2 TR) is coupled to the first pad structure (B Block pad1) of the second memory block (B Block) through a second local line contact plug.

In the same manner as in the first memory block (A Block), transistors having the same arrangement structure as the second transistor group TR2 may be repeatedly arranged along the extension direction of the second memory block (B Block).

For example, a fourth transistor group TR4 may include a first pass transistor (A_4 TR) coupled to the first memory block (A Block), and a second pass transistor (B_4 TR) coupled to the second memory block (B Block). In this case, the first pass transistor (A_4 TR) is coupled to the second pad structure (A Block pad2) of the first memory block (A Block) through a first local line contact plug, and the second pass transistor (B_4 TR) is coupled to the second pad structure (B Block pad2) of the second memory block (B Block) through a second local line contact plug.

That is, two pass transistors contained in one transistor group may respectively use local word lines and share a global word line, so that the number of global word lines is reduced by half, and the space the wiring structure consumes is decreased.

Figure 5:
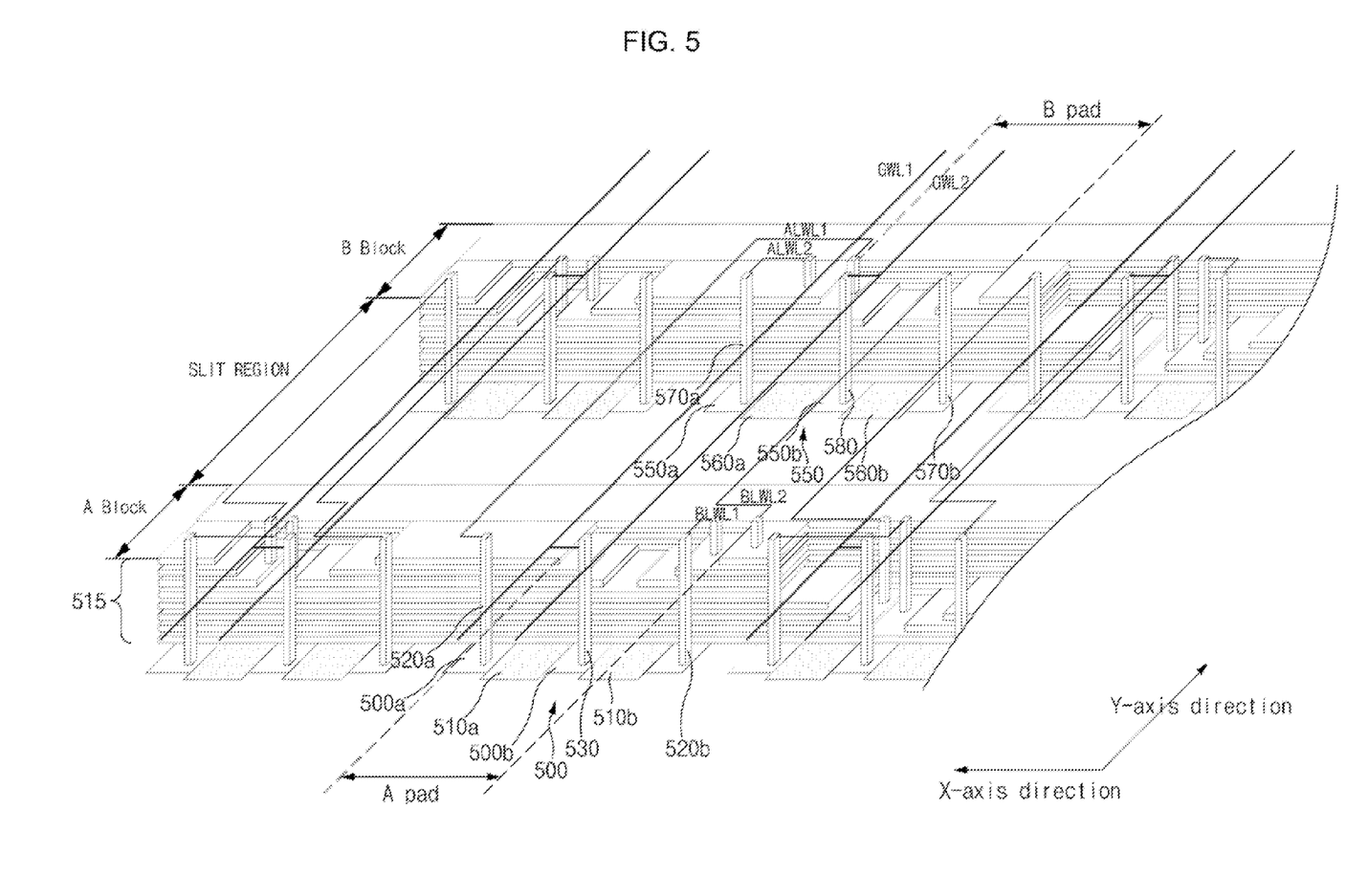

FIG. 5 is a stereoscopic view illustrating the connection relationship between a pass transistor region and a memory block of the semiconductor device shown in FIG. 4.

Referring to FIG. 5, a semiconductor substrate (not shown) including a cell region and a pass transistor region is provided. A first memory block (A Block) and a second memory block (B Block) are formed over the semiconductor substrate of the cell region.

Each of the first memory block (A Block) and the second memory block (B Block) may include a word line multilayered structure 515 extended in the direction parallel to the active region 500. The word line multilayered structure 515 may be formed by alternately stacking a word line conductive material and an insulation film. A slit for separating the first memory block (A Block) and the second memory block (B Block) from each other may be formed by etching the word line multilayered structure 515.

A first pad structure (A Pad) and a second pad structure (B Pad) are respectively contained in the first memory block (A Block) and the second memory block (B Block). The pad structures may be repeatedly arranged in the extension direction of the first memory block (A Block) and the second memory block (B Block).

The first pad structure (A Pad) and the second pad structure (B Pad) may be formed by etching the word line multilayered structure 515 in a stepped shape, and the horizontally symmetrical pad structures may also be formed. Although the embodiment has exemplarily disclosed only the horizontally symmetrical pad structures for better understanding of the present disclosure, the scope or spirit of the embodiment is not limited thereto, and horizontally asymmetrical pad structures may also be formed in one slimming region. In addition, the upper and lower ends of the pad structures may have different heights from those of the other pad structures adjacent thereto.

A plurality of active regions (500, 550) may be formed over the semiconductor substrate in the pass transistor region of the first memory block (A Block) and the second memory block (B Block). Each of the active regions (500, 550) may be formed in a bar shape having a long-axis and a short-axis. The long-axis of the active regions (500, 550) is a first direction (X-axis direction) indicating an extension direction of the word line multilayered structure 515 of the memory blocks (A Block, B Block), and the short-axis of the active regions (500, 550) is a second direction (Y-axis direction) perpendicular to the word line multilayered structure 515 of the memory blocks (A Block, B Block).

A first transistor is arranged over the active region 500 located below the first memory block (A Block). The first transistor includes first and second gate electrodes 510*a* and 510*b* crossing the active region 500, and first and second junction regions 500*a* and 500*b*.

The first junction region 500*a* may be formed in the active region 500 located at one side of the first gate electrode 510*a* and the second gate electrode 510*b*, and may be used as a source junction region. The second junction region 500*b* may be formed in the active region 500 disposed between the first gate electrode 510*a* and the second gate electrode 510*b*, and may be used as a drain junction region.

A second transistor is formed over the active region 550 located below the second memory block (B Block). The second transistor includes third and fourth gate electrodes 560*a* and 560*b* crossing the active region 550, and third and fourth junction regions 550*a* and 550*b*.

In this case, the first gate electrode 510*a* of the first transistor and the third gate electrode 560*a* of the second transistor are coupled to the second memory block (B Block), and the second gate electrode 510*b* of the first transistor and the fourth gate electrode 560*b* of the second transistor are coupled to the first memory block (A Block).

A first local line contact plug 520*a* is formed over the first junction region 500*a* located at the edge part of the active region 500 formed at one side of the first gate electrode 510*a*, and a second local line contact plug 520*b* is formed over the first junction region 500*a* located at the edge part of the active region 500 formed at one side of the second gate electrode 510*b*. The first local line contact plug 520*a* is coupled to the second pad structure (B Pad) of the second memory block (B Block), and the second local line contact plug 520*b* is coupled to the first pad structure (A Pad) of the first memory block (A Block).

In addition, a first local line contact plug 570*a* is formed over the first junction region 550*a* located at the edge part of the active region 550 formed at one side of the third gate electrode 560*a* of the second transistor. A second local line contact plug 570*b* is formed over the first junction region 550*a* located at the edge part of the active region 550 formed at one side of the fourth gate electrode 560*b*. The first local line contact plug 570*a* is coupled to the second pad structure (B Pad) of the second memory block (B Block), and the second local line contact plug 570*b* is coupled to the first pad structure (A Pad) of the first memory block (A Block).

A global line contact plug 530 is formed over the second junction region 500*b* located at the center part of the active region 500 disposed between the first gate electrode 510*a* and the second gate electrode 510*b* of the first memory block (A Block), and a global word line (GWL1) coupled to the global line contact plug 530 is also formed over the second junction region 500*b*.

In addition, a global line contact plug 580 is formed over the second junction region 550*b* located at the center part of the active region 550 disposed between the third gate electrode 560*a* and the fourth gate electrode 560*b* of the second memory block (B Block), and a global word line (GWL2) coupled to the global line contact plug 580 is also formed over the second junction region 550*b*.

In the related art, as a local word line and a global word line are to be allocated to each of a plurality of transistors, the occupied space increases. In contrast, according to the embodiment of the present disclosure, as transistors are arranged in such a manner that two memory blocks may use the global word line in common, the space consumed by the wiring structure is decreased, resulting in a reduction in chip size.

As is apparent from the above description, two gate electrodes are arranged in one active region of the pass transistor region, and are configured to commonly use one global word line, so that the area occupied by metal lines is reduced in size.

In addition, as the area occupied by metal lines is reduced in size, an efficient metal line structure is proposed, resulting in reduction in the chip area consumed.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

Various alternatives and equivalents are of the embodiments are possible. The invention is not limited by the type of deposition, etching, polishing, and patterning steps described herein. Nor are embodiments limited to any specific type of semiconductor device. For example, embodiments may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first memory block and a second memory block in a cell region;
   a first transistor group disposed under the first memory block and including a first pass transistor and a second pass transistor; and
   a second transistor group disposed under the second memory block and including a third pass transistor and a fourth pass transistor,
   wherein the first pass transistor electrically couples a first global word line to a first word line of the first memory block and the second pass transistor electrically couples the first global word line to a first word line of the second memory block,
   wherein the third pass transistor electrically couples a second global word line to a second word line of the first memory block and the fourth pass transistor electrically couples the second global word line to a second word line of the second memory block.

2. The semiconductor device according to claim 1, wherein the first transistor group includes:
   a first active region;
   a first gate electrode and a second gate electrode crossing the first active region;

a first local line contact disposed at a first side of the first gate electrode;
a second local line contact disposed at a second side of the second gate electrode; and
a first global line contact disposed between the first gate electrode and the second gate electrode.

3. The semiconductor device according to claim 2, wherein each of the first memory block and the second memory block includes:
a word line multilayered structure that extends in parallel to a long axis of the active region.

4. The semiconductor device according to claim 1, wherein the first memory block and the second memory block are separated from each other by a slit.

5. The semiconductor device according to claim 1, wherein each of the first memory block and the second memory block includes:
a pad structure having a step-shaped word line multilayered structure.

6. The semiconductor device according to claim 2, wherein the first global line contact is coupled to flail the first global word line.

7. A semiconductor device comprising:
a cell region configured to include a first memory block and a second memory block; and
a pass transistor region disposed under the cell region, wherein the pass transistor region includes:
a first pass transistor disposed under the first memory block that electrically couples a first global word line to a first word line of the first memory block;
a second pass transistor disposed under the first memory block that electrically couples the first global word line to a first word line of the second memory block;
a third pass transistor disposed under the second memory block and coupled to a second word line of the first memory block; and
a fourth pass transistor disposed under the second memory block and coupled to a second word line of the second memory block.

8. The semiconductor device according to claim 7, wherein each of the first memory block and the second memory block includes a word line multilayered structure extended along a direction parallel to long axes of the first active region and the second active region.

9. The semiconductor device according to claim 7, wherein the first memory block and the second memory block are separated from each other by a slit, and each of the first memory block and the second memory block further includes a pad structure having a step-shaped word line multilayered structure.

10. The semiconductor device according to claim 2, wherein the first local line contact is coupled to a word line of the first memory block.

11. The semiconductor device according to claim 2, wherein the second local line contact is coupled to a word line of the second memory block.

12. The semiconductor device according to claim 1, wherein the second transistor group includes:
a second active region;
a third gate electrode and a fourth gate electrode crossing the second active region;
a third local line contact disposed a first side of the third gate electrode;
a fourth local line contact disposed a second side of the fourth gate electrode; and
a second global line contact disposed between the third gate electrode and the fourth gate electrode.

13. The semiconductor device according to claim 12, wherein the third local line contact is coupled to a word line of the first memory block.

14. The semiconductor device according to claim 12, wherein the fourth local line contact is coupled to a word line of the second memory block.

15. The semiconductor device according to claim 12, wherein the second global line contact is coupled to a second global word line.

16. The semiconductor device according to claim 7, wherein the first pass transistor includes:
a first gate electrode disposed over a first active region;
a first local line contact disposed a first side of the first gate electrode and coupled to a word line of the first memory block; and
a first global line contact disposed a second side of the first gate electrode and coupled to a first global word line.

17. The semiconductor device according to claim 16, wherein the second pass transistor includes:
a second gate electrode disposed over the first active region;
a second local line contact disposed a second side of the second gate electrode and coupled to a word line of the second memory block; and
the first global line contact.

18. The semiconductor device according to claim 7, wherein the third pass transistor includes:
a third gate electrode disposed over a second active region;
a third local line contact disposed a first side of the third gate electrode and coupled to a word line of the first memory block; and
a second global line contact disposed a second side of the third gate electrode and coupled to the second global word line.

19. The semiconductor device according to claim 18, wherein the fourth pass transistor includes:
a fourth gate electrode disposed over the second active region;
a fourth local line contact disposed a second side of the fourth gate electrode and coupled to a word line of the second memory block; and
the second global line contact.

* * * * *